United States Patent [19]
Genheimer et al.

[11] Patent Number: 5,150,050
[45] Date of Patent: Sep. 22, 1992

[54] ADAPTIVE VARIABLE THRESHOLD QUALIFICATION LEVEL CIRCUIT FOR SIGNAL PROCESSING IN DISK DRIVES

[75] Inventors: Stephen R. Genheimer; Steven L. Welty, both of Mustang, Okla.

[73] Assignee: Seagate Technology, Inc., Scotts Valley, Calif.

[21] Appl. No.: 559,857

[22] Filed: Jul. 30, 1990

[51] Int. Cl.⁵ .................... G01R 33/12; G11B 27/36
[52] U.S. Cl. ................................. 324/212; 360/31
[58] Field of Search ......................... 324/210-212; 360/31, 53; 371/10.1, 16.5, 21.1, 21.6

[56] References Cited

U.S. PATENT DOCUMENTS

| | | |
|---|---|---|
| 3,725,855 | 4/1973 | Andersen . |
| 4,074,325 | 2/1978 | Sakai et al . . |
| 4,480,276 | 10/1984 | Batey et al. . |
| 4,516,162 | 5/1985 | West ............................. 360/31 |
| 4,629,933 | 12/1986 | Bucska et al. . |
| 4,823,360 | 4/1989 | Tremblay et al. . |

Primary Examiner—Walter E. Snow
Attorney, Agent, or Firm—Kinney & Lange

[57] ABSTRACT

A pulse qualification apparatus and method provides for qualifying signal pulses from a raw data signal by comparison to a variable qualification level. Pulse qualification is done on a read signal developed by moving a magnetic transducer relative to addressable portions of a magnetic disk. A qualification level generator circuit generates a qualification level signal which varies in value depending upon the addressed portion of the magnetic disk. A threshold detector is used in qualifying pulses from a transducer read signal by comparison to the qualification level signal to generate an encoded pulse signal representing occurrences of qualifying pulses. Error recovery is accomplished by increasing or decreasing the qualification level of the address portion of the magnetic disk where the error occurs. This process is repeated until qualifcation channel requirements are met. Using variable qualification for defect on a magnetic disk consists of running a manufacturing test process with qualification levels raised slightly from normal operation to detect defects which are caused by reduced amplitude. Likewise, operation with reduced qualification levels detects extra amplitude defects. The address locations of these defects are then mapped into memory.

16 Claims, 3 Drawing Sheets

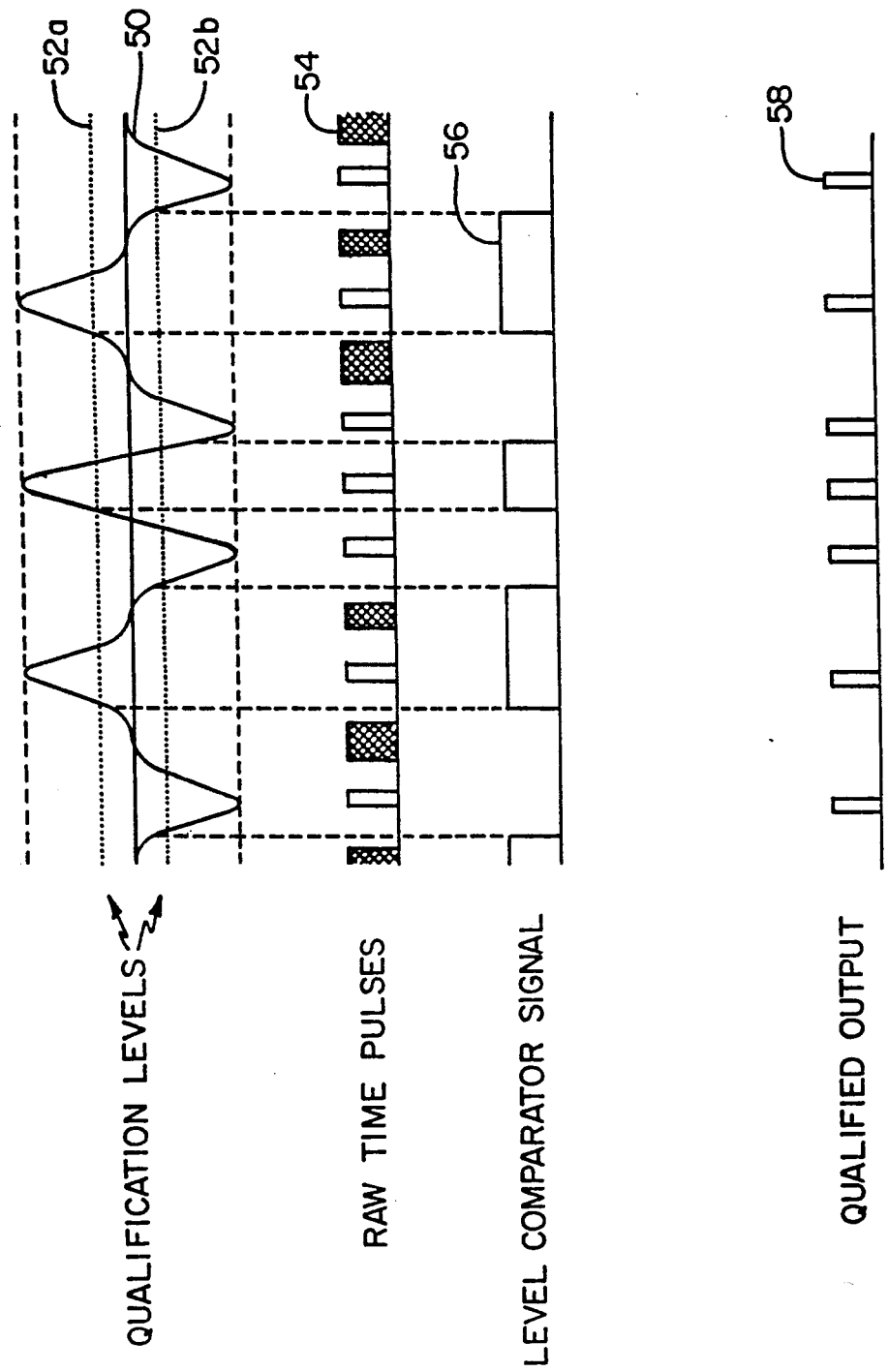

ADAPTIVE VARIABLE THRESHOLD QUALIFICATION LEVEL CIRCUIT FOR SIGNAL PROCESSING IN DISK DRIVES

REFERENCE TO CO-PENDING APPLICATION

Application Ser. No. 07/433,477, entitled VARIABLE LEVEL QUALIFICATION PULSE DETECTOR, filed on Nov. 8, 1989, and assigned to the same assignee as the present application is presently co-pending with the present application. Reference is hereby made to the co-pending application.

BACKGROUND OF THE INVENTION

The present invention relates to defect detection in and error recovery from magnetic media. More particularly, the present invention relates to detection finding and error recovery using variable level qualification from a raw data signal generated by movement of a magnetic transducer relative to the surface of a magnetic disk.

A magnetic disk, such as used in a computer disk drive, is a flat circular platter with a magnetic surface on which data can be stored by selective polarization of portions of the magnetic surface. The presence or absence of polarity transitions between the polarized portions represents particular binary values. Typically, the magnetically polarized portions are arranged in a plurality of radially concentric tracks on the surface to aid in location and readback of the data.

A magnetic transducer moving relative to the magnetic disk along a given track generates an electrical signal (the "read signal"), which is related to the states of polarization encountered along the track. Pulses in the read signal, i.e. brief excursions in the signal value from its normal or initial level, correspond to the magnetically polarized portions of the magnetic disk. Ideally, the read signal would not be influenced by any other factors. Unfortunately, other factors must be taken into account. In the read signal, data is indicated by pulse polarity transitions. However, not all pulses appearing in the read signal are true (and some pulses may be missing) thus sorting the data from the noise has become a major concern in signal processing for magnetic disk drives.

Read signal strength varies with the strength of the magnetic flux density encountered by the magnetic transducer as it moves across the magnetic disk. The strength of the encountered magnetic flux density in turn depends upon the spacing of the transducer from the surface of the magnetic disk, the orientation of the transducer relative to the tracks, the accuracy of positioning the transducer relative to the data tracks, the data coding scheme employed and many other factors.

The above factors can also affect the strength of the polarization of the magnetic surface where the same transducer is used to write data to the disk. For example, increased spacing between transducer and surface reduces the strength of polarization from writing to the disk. An increase in spacing between transducer and surface will show up in the read signal as a weakening in the signal. Thus, the effects can be additive.

Automatic gain control has long been used to solve the problems relating to variation in basic signal strength. However, the problems of data reproduction become more severe with increasing data densities, and involve factors not compensated effectively for by automatic gain control, particularly defects in the magnetic disk, crosstalk and intersymbol interference. These problems can result in the appearance of false pulses in the readback signal.

Increases in the areal density of magnetically polarized portions on magnetic disks lead directly to increases in data storage capacity for a disk drive of a given size. However, increased storage densities lead to an increase in susceptibility of the read signal to crosstalk and intersymbol interference. Coding schemes directed toward increased data densities, moreover, can be expected to produce significantly more occasions where there are multiple peaks occurring above a static lowered qualification threshold or peaks located in the long baseline between widely separated pulses. Codes that employ wide "windows" in order to increase disk capacity have larger band widths and longer baselines leading to intersymbol interference and crosstalk susceptibility. The intersymbol interference and crosstalk problems are further exacerbated if the magnetic read head drifts slightly off track. Transducer orientation and spacing from the magnetic media surface also effect crosstalk and intersymbol interference problems. These factors decrease the signal-to-noise ratio of the read signal and make determination of which pulses are true ever more difficult. False pulses, e.g. pulses related to transducer pickup of crosstalk, and missed true pulses or defects in the magnetic disk cause data decoding problems, and can result in inconsistent operation of a phase locked loop used to recover the "clock" or timing of the data.

A technique for eliminating many false pulses from a raw data signal is to subject the raw data signal to pulse threshold qualification. Threshold qualification requires that a pulse in the raw data signal exhibit a predetermined minimum signal level (qualification level) as one step in qualification of the pulse as one having a high likelihood of being a true pulse. In the prior art, a single qualification level has been set for an entire magnetic disk, or even an entire stack of magnetic disks in multi-platter applications. The qualification level has been selected so that there are an equal number of "dropouts" and "extra" pulses due to the noise present in a raw data signal.

SUMMARY OF THE INVENTION

The present invention provides an improved apparatus for the threshold qualification of signal pulses in a raw data signal or in a transducer read signal that has been subjected to automatic gain control signal processing. The read signal is developed by moving a magnetic transducer relative to addressable tracks on a magnetic disk. The pulse qualifying apparatus includes a microprocessor for receiving address data as part of a read operation executed on a magnetic disk in a disk drive unit. The microprocessor accesses memory for data indicative of optimized qualification level signals for use in qualifying signal pulses, relating to a portion or address on the disk accessed, to generate a qualification level signal for use in qualifying pulses from the raw data signal.

Depending upon the embodiment of the invention, optimized qualification levels are one of two types. In one embodiment, optimal qualification levels for a disk drive are determined as part of the design process for a class of disk drive. Alternatively, optimal qualification levels can be determined for an individual disk drive as part of testing of the drive after manufacture. To determine optimal qualification levels in either case, known data patterns are stored to selected tracks of the magnetic disk and then read back repeatedly. The qualification level is varied with respect to each track until reading errors are minimized. The qualification level for which reading errors are minimized becomes the optimal qualification level for the respective track. For the first embodiment this test is done for a representative drive, for the second embodiment the test is executed on individual drives. In either case, data representing the qualification levels is stored to the disk for later recovery and use by a disk drive.

As noted above, optimal qualification levels are determined for given tracks or addresses on a given disk. In one embodiment, optimized qualification levels are provided for reference tracks on a magnetic disk, typically the innermost and outermost tracks, and an interpolation performed by the microprocessor to generate qualification levels for the intermediate tracks. Thus, reception of read command will result in generation of a particular qualification level for threshold qualification of pulses detected from the specified track. In another embodiment, qualification levels are provided for each track on the disk, or more practically, for bands of adjacent tracks on the disk. Generation of a qualification level by interpolation is done by the microprocessor to determine a qualification level signal for an addressed track other than the two reference tracks. The interpolation qualification level signal is typically a weighted average of the signals for the reference tracks.

The microprocessor then generates a qualification level generation signal and applies it to a filter network. The qualification level generation signal is converted to an analog signal level of the appropriate qualification level. A threshold detector then qualifies pulses from a raw data signal using the qualification level signal.

DEFECT DETECTION

The most time consuming portion of the manufacturing test process of a magnetic disk drive is to adequately map media defects. The goal is to find all of the defects the end user would see in normal operation during the life of the disk drive and then map them during the manufacturing test process. To accomplish this in a reasonable time requires running the drive under reduced margins for stressed conditions. This has been done in the past by using reduced timing windows to detect errors caused by mispositioning of data and actuator offsets. There are certain types of defects, however, which are characterized by amplitude problems only, with no corresponding timing shift. If the drive is run in the test process with qualification levels raised slightly from normal operation, marginal "drop outs", e.g. defects which are caused by reduced amplitude, can be detected. Likewise, operation with reduced qualification levels can detect marginal "drop ins", e.g. extra amplitude defects.

ERROR RECOVERY

When a read error is detected during normal operation, the controller typically initiates an error recovery procedure. The typical error recovery procedure consists of attempts to re-read the defective data with different combinations of actuator offsets and read data strobe offsets. Certain types of defects, however, create "qualification" errors, e.g. a signal amplitude problem in which the qualification channel requirements are not met. Variable qualification, i.e., "qualification offsets", can be used to recover this type of error. Qualification offsets consist of one or more increments of increased or decreased qualification levels from the normal operating point and re-reading erroneously recovered data at the increased or decreased qualification levels.

BRIEF DESCRIPTION OF THE DRAWINGS

FIG. 3 is a set a waveforms including a magnetic transducer generated readout signal and a qualified output signal.

DETAILED DESCRIPTION OF THE PREFERRED EMBODIMENT

Figure 1A:
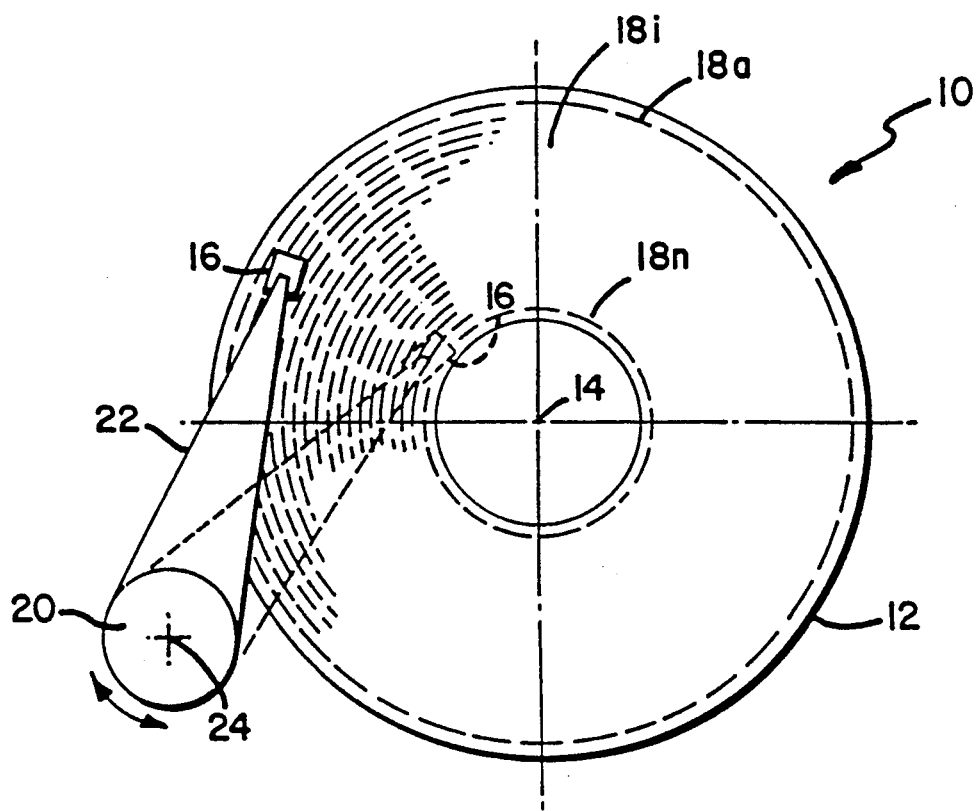
FIGS. 1A and 1B are a plan view and a partial cross sectional view, respectively, of a conventional disk drive.
Figure 1B:
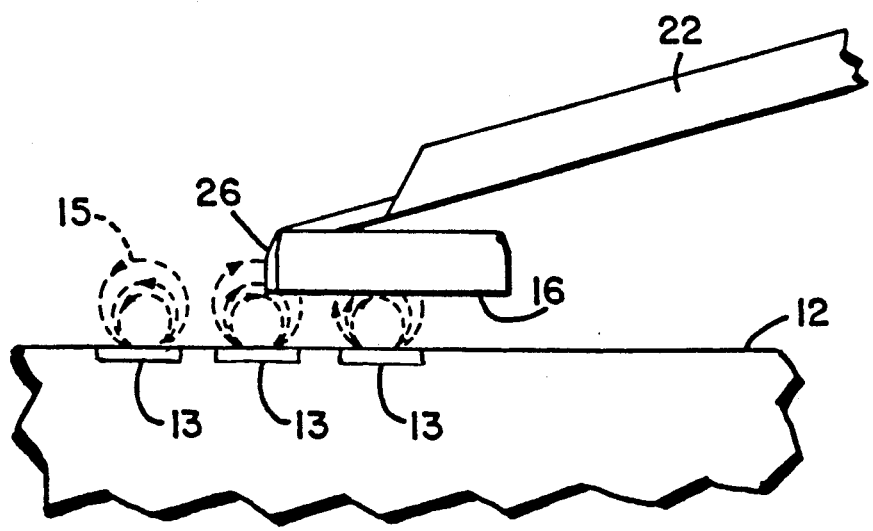

FIGS. 1A and 1B illustrate a disk drive 10 having a magnetic media data storage disk 12 and an associated slider 16 and rotary actuator 20. Changes in physical attitude between a magnetic transducer 26 and a magnetic disk 12 in a disk drive 10 are illustrated by the figures. Disk drive 10 is shown with a single magnetic disk 12, however, it will be understood by those skilled in the art that the present invention is applicable to disk drives including a plurality of magnetic disks. Magnetic disk 12 is mounted for rotation on a spindle centered on axis 14. Magnetic transducer 26 (shown in FIG. 1B) is mounted on a slider 16, which flies just over the surface of magnetic disk 12 during rotation of the disk. Data blocks are arranged in a plurality of radially concentric tracks 18a through 18n. Data tracks 18a and 18n are the outermost and innermost data tracks, respectively. A track 18i may be associated with similar tracks on each of a stack of disks to form a cylinder. Slider 16 is moved by a rotary actuator 20 to position transducer 26 over the appropriate data track 18i. Rotary actuator 20 includes an actuator arm 22 which extends from a proximal end mounted for rotation on axis 24. Slider 16 is mounted at the distal end of actuator arm 22.

Slider 16 has a relative position with respect to a given track 18i which becomes increasingly oblique as tracks of smaller radius are accessed. Magnetic disk 12 rotates at a constant angular velocity and accordingly the relative speed of slider 16 over magnetic disk 12 decreases as slider 16 is brought over increasingly smaller circumference tracks 18i. This usually results in a decrease in slider 16 flying height, i.e. the spacing between slider 16 and magnetic disk 12.

Magnetic transducer 26 is positioned on a face of slider 16 perpendicular to the surface of magnetic disk 12. Transducer 26 senses magnetic flux lines 15 emitted from polarized portions 13 of magnetic disk 12. The spacing between transducer 26 and the surface of magnetic disk 12 affects the strength of the magnetic flux lines 15 swept by transducer 26. In addition, the angular orientation of transducer 26 affects the ability of the transducer to sense the magnetic flux lines as well as its susceptibility to detection of magnetic flux lines 15 from adjacent tracks or from preceding or following polarized portions 13 for a given track 18i. Polarized portions 13, depending on the coding scheme, can vary in spacing from one another, further affecting susceptibility of transducer 26 to detection of magnetic flux. Magnetic transducer 26 generates a read signal which is characterized by positive going or negative transitions in pulses associated with the direction of transition of states of polarization of portions 13. It is highly preferable that only true pulses exceed threshold qualification levels. However, as a result of changes in orientation of transducer 26 with respect to polarized portions 13, susceptibility of the transducer to reading nearby polarized portions 13 changes. Reductions in spacing between portions 13 accentuate problems caused by irregularities in the surface of the storage medium and increase crosstalk. Thus, a different optimal qualification level signal exists for each track 18$i$.

Pulse qualification is a method of peak detection employed to select pulses from the raw data signal having a high probability of association with actual data stored on magnetic disk 12. A variety of pulse qualification schemes exist in the art, but a common feature of many is the use of a threshold qualification level signal. While a given peak may be rejected or accepted for a variety of reasons, as a preliminary matter no peak is considered unless it has an absolute magnitude greater than the qualification level signal. As an example, one common scheme provides that the first pulse peak after a zero crossing which also exceeds the qualification level is associated with data. Such a peak can be detected using time differentiation circuitry. Whatever the qualification scheme, only qualified pulses are represented in the encoded pulse data signal. Polarity detection is used, in certain coding schemes to insure that the peaks alternate in polarity.

Figure 2:
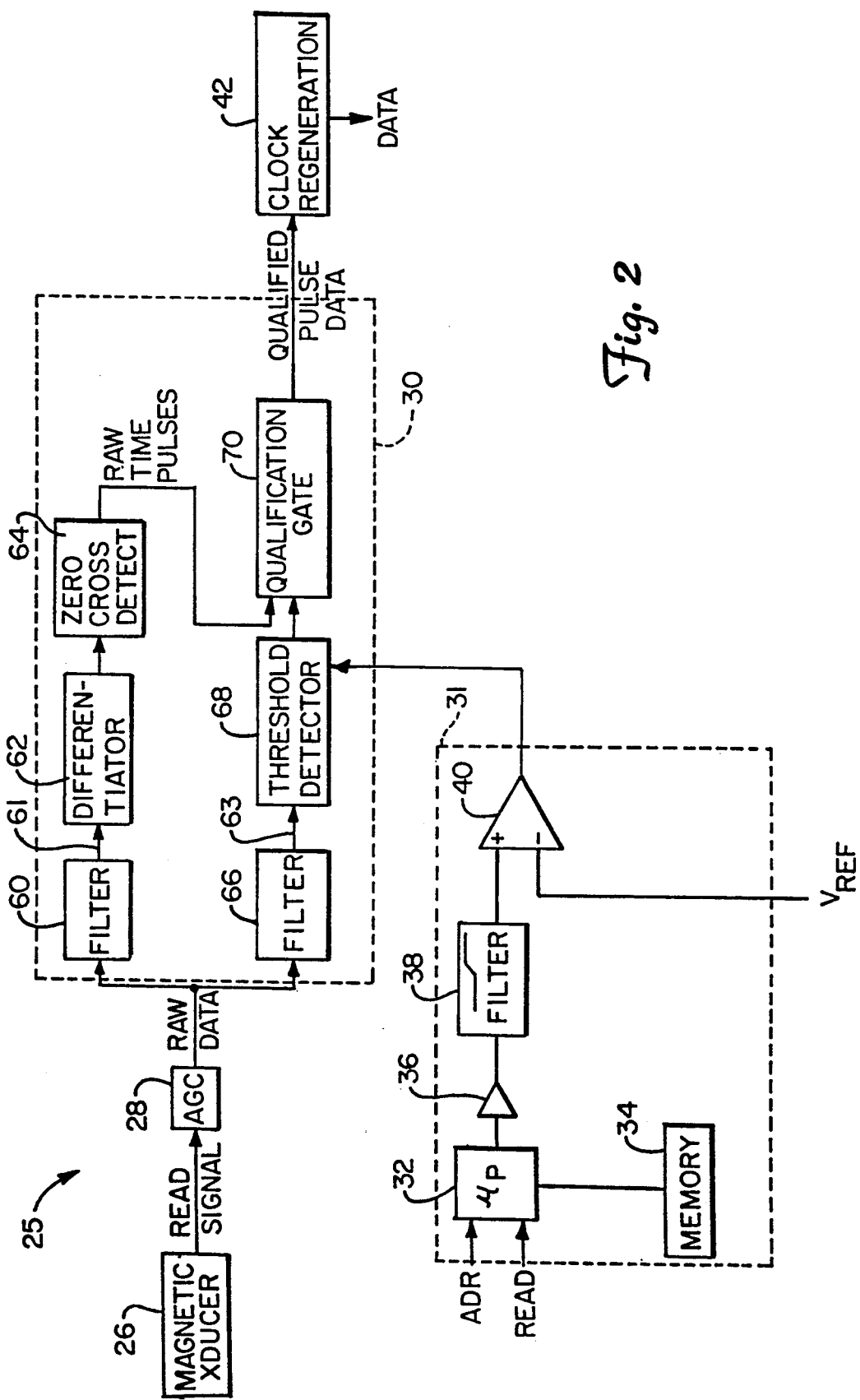
FIG. 2 is a block diagram of a pulse qualification network.

FIG. 2 illustrates qualification circuitry 25, which includes a magnetic transducer 26, Automatic Gain Control ("AGC") circuitry 28, a qualification circuit 30, a qualification level signal generator 31, and clock regeneration and data recovery circuitry 42. Qualification level signal generator 31 includes a microprocessor 32, memory 34 accessible by microprocessor 32, an amplifying buffer 36, a low frequency cutoff filter 38, and an operational amplifier 40. Qualification signal level generator 31 provides threshold qualification signals which are disk address dependent and which vary as read address varies.

Magnetic transducer 26 develops a read signal which is amplified by automatic gain control stage 28. Automatic gain control stage 28 passes the signal, now designated as the raw data signal, to qualification circuit 30. As the output from automatic gain control stage 28, the raw data signal has been amplified to adjust for signal strength variation resulting from changes in attitude and spacing of the transducer relative to tracks 18$i$ and disk 12.

Qualification circuit 30 receives the qualification level signal reference from qualification level signal generator circuit 31 and the raw data signal. Qualification circuit 30 generates a qualified pulse output signal used by clock regeneration circuit 42 for recovering a clock signal and data. A variety of qualification circuits are available as integrated circuits, such as the 8464 processor available from National Semiconductor.

Qualification circuit 30 includes a high resolution channel 61 for recovering timing of zero crossings of the differential of the raw data signal and a low resolution channel 63 which is used for pulse threshold amplitude qualification of the raw data signal. High resolution (timing) channel 61 includes a band pass filter 60 for noise filtering, a differentiating circuit 62 for determining points on the raw data signal where the time rate of change of the signal is zero, and a zero cross detect circuit 64 which generates pulses associated with zero crossings of the time differential of the raw data signal. Raw time pulses (shown in FIG. 3 as signal 54) are passed to qualification gate 70.

Low resolution channel 63 includes a bandpass filter 66 for noise filtering, and a threshold detector 68 for qualifying pulses. Threshold detector 68 generates a level comparator signal 56 (illustrated in FIG. 3), which cycles between one of two states in response to each crossing of the opposite polarity threshold level. In other words, the level comparator signal assumes a new value with the first crossing of given polarity threshold after a crossing of the opposite polarity threshold but not after a repeated crossing of the same polarity threshold. The threshold qualification level is established by qualification level signal generator 31. Raw time pulses and the level comparator signal are all received by qualification gate 70, which outputs qualified pulse data to clock regeneration circuit 42 for the recovery of data.

A variable threshold qualification level is set by microprocessor 32 in qualification level signal generator 31. Microprocessor 32, depending upon application, may be the same microprocessor as used by a disk drive controller. Microprocessor 32 receives a logic block address and a read command from a host computer over an interface between the host computer and microprocessor 32. The logic block address is translated by microprocessor 32 into head (e.g. transducer 26) and cylinder information. Head and cylinder information correspond to identification of a specific track 18$i$ on a specific disk 12. Microprocessor 32 then determines a qualification level for data pulses read from the specific track 18$i$.

Microprocessor 32 generates a qualification level signal by retrieving selected optimal qualification level signal data from memory 34 and, if required by the embodiment of the invention employed, by an interpolation performed on the optimal qualification level signal data. In one preferred embodiment, optimal qualification level signal data for the innermost track 18$n$ and the outermost track 18$a$ are available. Tracks 18$a$ and 18$n$ serve as reference tracks for generation of qualification level signals for the remaining tracks. If track 18$n$ or 18$a$ is indicated by the logic block address, microprocessor 32 directs generation of the optimal qualification level signal for the indicated track. For any track 18$i$ between tracks 18$a$ and 18$n$, microprocessor 32 executes an interpolation of the qualification level signals based upon the spacing of track 18$i$ from the reference tracks 18$a$ and 18$n$. The interpolation is preferably a straight line averaging of the optimal qualification level signals for the reference tracks, weighted to reflect their proximity to the addressed track.

Alternatively, three or more reference tracks may be employed, permitting an interpolation between more closely spaced tracks. In yet another embodiment, reference tracks are provided for bands of adjacent tracks, and the reference track qualification level signal is employed for all tracks in the band. Best results would be obtained by providing data for a discrete optimized qualification level signal for each and every track.

Microprocessor 32 generates a qualification level generation signal comprising pulses of varying width. The width of the pulses is related to the magnitude of the qualification level. The pulses are transmitted to an amplifying buffer 36 and then to a low frequency cutoff filter 38. Filter 38 operates as a fast time decay charge pump to convert the pulses to a D.C. signal, the magnitude of which varies with the width of the emitted pulses. In other words, the output of microprocessor 32 is subjected to a type of digital-to-analog (D/A) conversion. Those skilled in the art will realize that other types of (D/A) conversion can be used, such as for example, pulse width modulation. The D.C. signal is provided the noninverting input of an operational amplifier 40, which in turn generates the qualification level signal.

In the preferred embodiments the reference qualification level data is written to disk 12. The optimal qualification level signals for the reference tracks (or all tracks should such be desired) can be determined during testing of a prototype disk drive during development of a specific product type. Alternatively, superior results can be obtained if qualification data for individual drive units is generated by testing of each unit. Known data patterns are written to, then read from the reference tracks of a disk. Read back is done using various qualification levels. Generally, the qualification level providing the lowest error rate is optimal. If a group of error free levels proved available, a value centered among these levels, if a continuum, is used. These values are stored to the disk for read back by the disk upon power up. The drive stores the data to memory 34 for quick access during operation of the drive.

In order to recover the amplitude errors detected during a normal read cycle, the qualification level signal for the address location is varied and the data is re-read. For example, during a normal read operation, when an extra amplitude error is detected, the error may be only a marginal error. Hence, to recover valid data, the qualification level signal is increased by a desired increment, and the data is re-read. Likewise, when a low amplitude read error occurs, the qualification level signal is decreased and the data is re-read. The process of increasing or decreasing the qualification level signal by a desired increment before re-reading data continues until the data is recovered and no amplitude error is detected.

The preferred embodiment for mapping defects of a magnetic disk 12 uses a variable qualification level signal generated by the variable qualification level signal generator 31. The amplitudes of the pulses in the read signal are compared with the qualification level signal and if a defect should be detected, the address location of the defect is mapped in memory. Defects caused by reduced signal amplitude are detected by setting the qualification level signal to a desired level above the normal qualification level for the specific track. The data on the track is read and a marginally low amplitude read signal prompts an error since the amplitude of the read signal does not properly compare with the new, raised qualification level.

Likewise, defects caused by extra amplitude are detected by setting the qualification level signal to a desired level below the normal operation level. A read signal with a marginally high amplitude will prompt an error since it will improperly exceed the new, lowered qualification level. By running the drive under these stressed qualification levels, many otherwise undetectable errors are detected. These errors are mapped by the microprocessor 32 into memory 34.

FIG. 3 is a set of timing diagrams illustrating the interrelationship of various signals discussed above. Signal 50 is the raw data signal provided qualification circuit 30 by automatic gain control circuitry 28. Positive and negative qualification level signals are indicated by lines 52a and 52b, respectively. Signals 52a and 52b are of equal magnitude with respect to a center or zero reference voltage level. The magnitude of signals 52a and 52b is established by qualification level signal generator 31.

Raw time pulses 54 are associated with a time rate of change of raw data signal 50 equal to zero, i.e. possible peaks of the signal Differentiation circuitry in qualification circuit 30 determines points of zero slope. Zero crossing detector 64 generates pulses with crossings of the zero signal level. The width of the pulses result from noise on the signal, and subsequent repeated crossings (and repeated, closely grouped) output pulses from zero crossing detector 64. In accordance with the preferred qualification scheme, only the first occurrence of a peak after a crossing of the qualification level for a given polarity is taken as being associated with data. Level comparator signal 56 is a signal generated within qualification circuit 30 by threshold detector circuitry and which changes in value with the first crossing by the raw data signal of a qualification level of a given polarity subsequent to a crossing of the opposite polarity qualification level. The first peak in raw data signal 50 occurring after a change in value of the level comparator signal 56 is thus qualified. These pulses become the qualified output or encoded pulse signal 58. The encoded pulse signal 58 is not recovered data, but is used to recover the data clock to permit interpretation of the encoded pulses.

The present invention improves accuracy during read back of information from magnetic disks. The variable qualification level circuitry improves performance, especially when used with high density codes such as the 1, 7 code, with respect to accuracy of reading data. Read signal pulse strength variation no longer requires compromise in choice for a qualification level signal. Adaptable qualification, with close to optimal qualification level signal strength can be provided for any track on each disk drive.

The invention is particularly advantageous for use with high density coding schemes used to increase disk storage capacity. These codes tend to have larger bandwidths and longer baselines making them more susceptible to noise and crosstalk, especially if the magnetic read head is slightly off track. The present invention allows for reduced voltage qualification thresholds for many tracks, particularly useful in detecting low amplitude raw data signals such as those in which the minimum pulse separation is low and the amplitude has been reduced to lower the inter-symbol interference.

Although the present invention has been described with reference to preferred embodiments, workers skilled in the art will recognize that changes may be made in form and detail without departing from the spirit and scope of the invention.

What is claimed is:

1. An apparatus for detecting and mapping disk defects of a magnetic disk, the defects being detected from a raw data signal, having an amplitude, developed by relative movement of a magnetic transducer in a magnetic disk drive with respect to addressable portions of the magnetic disk, the apparatus comprising:
   a qualification level generator circuit suitable for generating a variable qualification level signal for qualifying signal pulses in the raw data signal;
   a controller, coupled to the qualification level generator circuit, for varying the qualification level signal to set a qualification threshold;
   a threshold detector, coupled to the controller and having the raw data signal as an input, for detecting disk defects resulting in the raw data signal failing to meet the qualification threshold, the controller causing the transducer to generate a second raw data signal corresponding to the addressable portions after the controller has varied the qualification level signal to detect additional disk defects; and mapping means, responsive to the threshold detector, for mapping the disk defects detected.

2. The apparatus of claim 1 wherein the variable qualification level signal varies in value depending upon the addressed portion of the magnetic disk.

3. The apparatus of claim 1 wherein the controller sets the qualification threshold to a desired level above a normal operation level, and wherein the threshold detector detects defects when the amplitude of the raw data signal is below the qualification threshold.

4. The apparatus of claim 1 wherein the controller sets the qualification threshold to a desired level below a normal operation level, and wherein the threshold detector detects defects when the amplitude of the raw data signal is above the qualification threshold.

5. The apparatus of claim 1 wherein the mapping means comprises:

memory means coupled to the controller for storing address locations of the addressable portions on the magnetic disk corresponding to the defects.

6. An apparatus for recovering amplitude errors detected during normal operation of a magnetic disk, the errors being detected from a raw data signal, having an amplitude, the raw data signal being representative of data read from the magnetic disk and developed by relative movement of a magnetic transducer with respect to addressable portions of the magnetic disk, the apparatus comprising:

a qualification level generator circuit generating a variable qualification level signal;

a threshold detector, coupled to the qualification level generator circuit and having the raw data signal as an input, for comparing the raw data signal to the qualification level signal and for detecting the amplitude errors when the raw data signal does not meet the qualification level; and a controller, coupled to the qualification level generator circuit, for varying the qualification level signal when an amplitude error is detected and for causing the data stored on the addressable portions to be re-read once the controller has varied the qualification level signal to recover amplitude errors.

7. The apparatus of claim 6 wherein the qualification level signal varies in value depending upon the addressed portion of the magnetic disk.

8. The apparatus of claim 6 wherein the controller varies the qualification level signal a desired increment above or below a normal qualification level signal value dependent upon the addressable portion of the magnetic disk then being addressed.

9. A method for mapping defects located at addressable locations on a magnetic disk using a read signal, the read signal having an amplitude and being generated by relative movement of a magnetic transducer, mounted on a slider, with respect to one of a plurality of concentric data tracks on the magnetic disk, the method comprising the steps of:

generating a variable qualification level signal having a normal operation level for qualifying pulses in the read signal;

comparing amplitudes of the pulses in the read signal with the qualification level signal generated;

detecting defects when the amplitude of the pulses in the read signal do not meet the qualification level signal;

varying the level of the qualification level signal;

repeating the steps of comparing and detecting; and mapping the defects detected.

10. The method of claim 9 wherein the step of mapping comprises:

storing the addressable locations corresponding to the defects in drive controller memory.

11. The method of claim 10 and further comprising:

controlling disk access based on the address locations stored.

12. The method of claim 9 wherein defects caused by reduced signal amplitude are detected by setting the qualification level signal to a desired level above the normal operation level.

13. The method of claim 9 wherein defects caused by extra signal amplitude are detected by setting the qualification level signal to a desired level below the normal operation level.

14. A method for recovering amplitude errors detected during a normal read cycle wherein data is read from address locations on a magnetic disk using a read signal having an amplitude, the read signal being generated by relative movement of a magnetic transducer, mounted on a slider, with respect to one of a plurality of concentric data tracks on the magnetic disk and the read signal having raw data pulses representing valid data stored at the address locations on the concentric tracks as well as invalid data, the method comprising:

reading data from address locations on the magnetic disk;

detecting a read error based on the data read;

varying a qualification level signal used for qualifying the raw data pulses; and re-reading data from the address locations on the magnetic disk after the qualification level signal is varied.

15. The method of claim 14 wherein the qualification level signal is increased one desired increment before re-reading data from the address locations on the magnetic disk.

16. The method of claim 14 wherein the qualification level signal is decreased one desired increment before re-reading data from the address locations on the magnetic disk.

* * * * *

UNITED STATES PATENT AND TRADEMARK OFFICE
CERTIFICATE OF CORRECTION

PATENT NO. : 5,150,050

DATED : September 22, 1992

INVENTOR(S) : STEPHEN R. GENHEIMER; STEVEN L. WELTY

It is certified that error appears in the above-identified patent and that said Letters Patent is hereby corrected as shown below:

On the title page,
In the References Cited section, under U.S. PATENT DOCUMENTS, delete "3,725,855 4/1973 Andersen",
insert "3,725,885 4/1973 Andresen"

Col. 8, line 55, delete "of", insert "on"

Signed and Sealed this

Twenty-first Day of September, 1993

Attest:

BRUCE LEHMAN

*Attesting Officer*    *Commissioner of Patents and Trademarks*